United States Patent
Chen et al.

(10) Patent No.: US 9,972,566 B2
(45) Date of Patent: *May 15, 2018

(54) INTERCONNECT ARRAY PATTERN WITH A 3:1 SIGNAL-TO-GROUND RATIO

(71) Applicant: International Business Machines Corporation, Armonk, NY (US)

(72) Inventors: Zhaoqing Chen, Poughkeepsie, NY (US); Matteo Cocchini, Long Island City, NY (US); Rohan U. Mandrekar, Sunnyvale, CA (US); Tingdong Zhou, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/336,884

(22) Filed: Oct. 28, 2016

(65) Prior Publication Data

US 2017/0048967 A1 Feb. 16, 2017

Related U.S. Application Data

(63) Continuation of application No. 14/824,125, filed on Aug. 12, 2015, now Pat. No. 9,646,925, which is a (Continued)

(51) Int. Cl.
*H01L 23/498* (2006.01)
*H01L 23/528* (2006.01)
(Continued)

(52) U.S. Cl.
CPC ...... *H01L 23/49838* (2013.01); *H01L 23/528* (2013.01); *H01L 23/66* (2013.01);
(Continued)

(58) Field of Classification Search
CPC ........... H01L 23/50; H01L 2224/73204; H01L 23/49838; H01L 23/49827; H01L 23/5286;
(Continued)

(56) References Cited

U.S. PATENT DOCUMENTS 6,641,411 B1 11/2003 Stoddard et al.
7,095,107 B2 8/2006 Ramakrishnan et al.
(Continued)

*Primary Examiner* — Dean Takaoka
*Assistant Examiner* — Alan Wong
(74) *Attorney, Agent, or Firm* — L. Jeffrey Kelly

(57) ABSTRACT

An electronic device including a plurality of interconnects are orthogonally arranged in a grid pattern and evenly spaced by a first distance, the plurality of interconnects include: a first conductor pair with conductors arranged next to each other in a first direction, the first direction is oriented diagonally relative to the orthogonal grid pattern, a second conductor pair with conductors arranged next to each other in a second direction substantially perpendicular to the first direction, each conductor of the second conductor pair is spaced by the first distance from each signal conductor of the first conductor pair, and a third conductor pair with conductors arranged next to each other in a third direction substantially parallel to the first direction, each conductors of the third conductor pair is spaced by the first distance from one of the signal elements of the second conductor pair.

19 Claims, 9 Drawing Sheets

Related U.S. Application Data continuation of application No. 14/551,185, filed on Nov. 24, 2014, now Pat. No. 9,543,241.

(51) Int. Cl.
  *H04B 3/32* (2006.01)
  *H01P 3/02* (2006.01)
  *H01P 3/08* (2006.01)
  *H05K 1/02* (2006.01)
  *H04B 1/00* (2006.01)
  *H01L 23/66* (2006.01)

(52) U.S. Cl.
  CPC ............... *H01P 3/02* (2013.01); *H01P 3/026* (2013.01); *H01P 3/081* (2013.01); *H04B 1/00* (2013.01); *H04B 3/32* (2013.01); *H05K 1/0216* (2013.01); *H05K 1/0245* (2013.01); *H01L 2223/6627* (2013.01)

(58) Field of Classification Search
  CPC ......... H01L 23/66; H01L 24/16; H01L 24/48; H01L 2223/6638; H05K 1/0245; H05K 1/0219; H05K 2201/09227; H05K 1/112
  USPC ......... 333/260; 174/261, 255; 257/697, 773, 257/689, E23.07, E23.151
  See application file for complete search history.

(56) References Cited

U.S. PATENT DOCUMENTS

| | | |
|---|---|---|
| 7,137,832 B2 | 11/2006 | Mongold et al. |
| 7,335,976 B2 | 2/2008 | Chen et al. |
| 7,347,701 B2 | 3/2008 | Daly et al. |
| 7,472,367 B1 | 12/2008 | Xie et al. |
| 7,671,273 B2 | 3/2010 | Douriet et al. |
| 7,833,023 B2 | 11/2010 | Di Stefano |
| 7,939,930 B2 | 5/2011 | Chen et al. |
| 8,203,206 B2 | 6/2012 | Chen et al. |
| 8,294,259 B2 | 10/2012 | Jiang et al. |
| 8,338,948 B2 | 12/2012 | Weekly et al. |
| 8,399,981 B2 | 3/2013 | Weekly et al. |
| 8,552,301 B2 | 10/2013 | Kusaka |
| 8,555,230 B2* | 10/2013 | Catuogno ........... G06F 17/5068 716/126 |
| 8,920,194 B2* | 12/2014 | Minich .............. H01R 13/6471 439/607.05 |
| 9,543,241 B2* | 1/2017 | Chen ....................... H01P 3/026 |
| 9,543,243 B2* | 1/2017 | Masleid .................. H01L 24/17 |
| 9,646,925 B2* | 5/2017 | Chen ....................... H01P 3/026 |
| 2009/0289348 A1 | 11/2009 | Tang et al. |
| 2010/0077363 A1 | 3/2010 | Catuogno |
| 2011/0168433 A1 | 7/2011 | Kusaka |
| 2013/0333933 A1 | 12/2013 | Mantiply et al. |
| 2016/0149611 A1 | 5/2016 | Chen et al. |
| 2016/0150638 A1 | 5/2016 | Chen et al. |

* cited by examiner

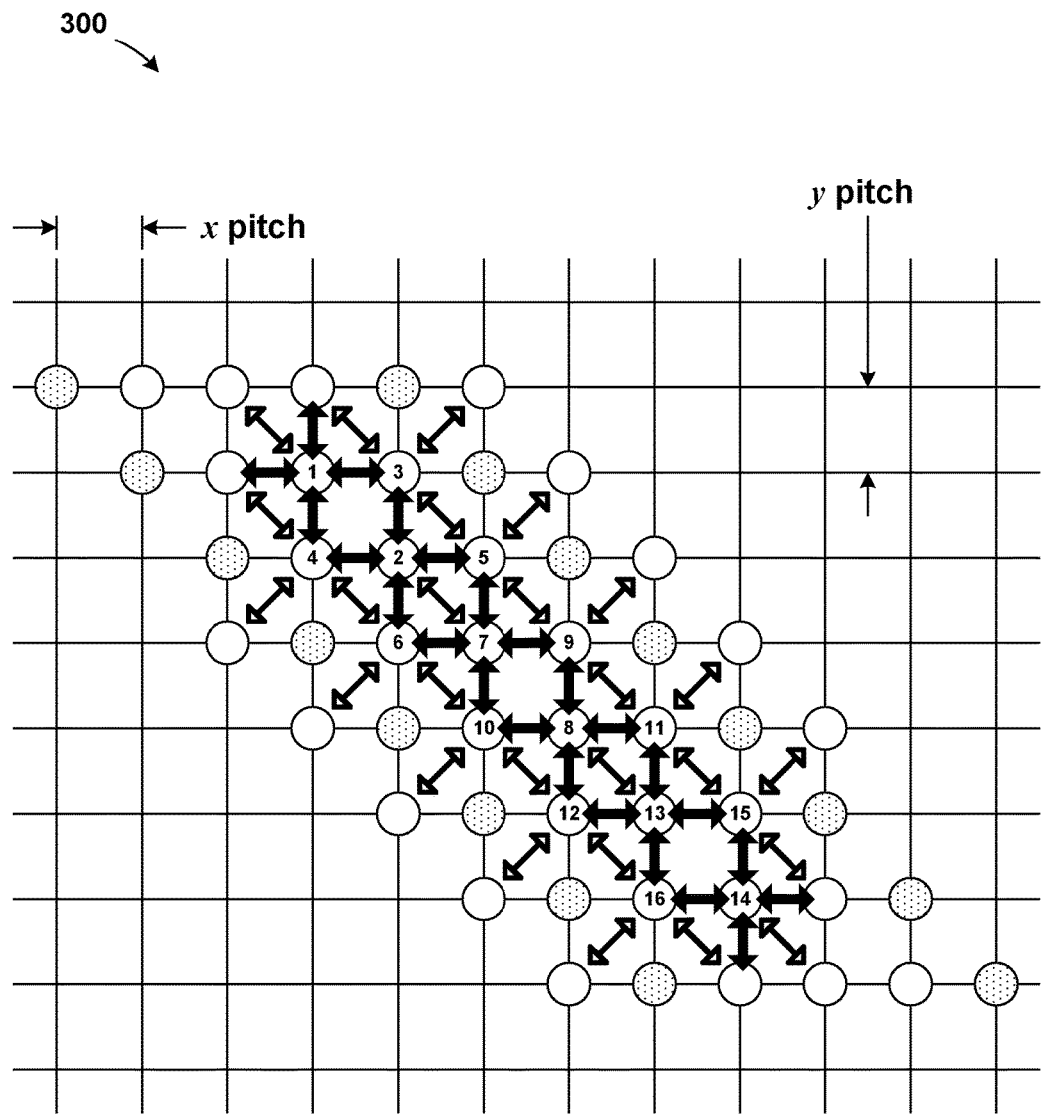
FIG. 6
Array Elements
⬤ Ground / Power
○ Signal
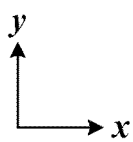

INTERCONNECT ARRAY PATTERN WITH A 3:1 SIGNAL-TO-GROUND RATIO

BACKGROUND

The present invention generally relates to electrical interconnects in integrated circuits, and more particularly to minimizing signal crosstalk using an interconnect array pattern with a 3:1 signal-to-ground ratio.

Signals may be transmitted in data processing systems using techniques such as signal-ended signaling and differential signaling. A signal is any data capable of transmission, for example, an electromagnetic field of electric current used to propagate data in a medium. Differential signaling, which uses differential transmission lines to transmit a signal, is often preferred in applications that require an extra degree of noise immunity.

A differential transmission line is a plurality of electrical conductors that complement one another in the transmission of a signal. The signal transmitted by the differential transmission line is indicated by a voltage difference between the conductors of the differential transmission line. For example, a differential transmission line may include two wires that are substantially parallel to one another, and which transmit a signal as indicated by a voltage difference between the two wires. Any noise source that induces more voltage on one conductor than the other will add a net noise in the signal that is equal to the difference in noise between the conductors.

Differential signaling may be used in different contexts. For example, differential signaling may be used in computers, circuits, computer networks, data transmission connectors, cables, power grids, low voltage applications, high voltage applications, low frequency application, and high frequency applications.

Differential signaling may be used in analog signaling, such as the analog signaling used in some audio and video systems. Differential signaling may also be used in digital signaling. For example, differential signaling is used in the EIA-422 and EIA-485 specifications for signaling. EIA-422 is the technical standard that specifies the electrical characteristics of the balanced voltage digital interface circuit. EIA-485 is an open system interconnection model physical layer electrical specification of a two-wire, half-duplex, multi-point serial connection. EIA-422 and EIA-485 are now administered by the Telecommunications Industry Association. Other exemplary uses of differential signaling in digital signaling include the use of differential signaling in the peripheral component interconnect express (PCI Express) and universal serial bus interface types.

Differential signaling may also be used in the high-speed digital serial interfaces of low voltage differential signaling, serial advanced technology attachment (Serial ATA), hypertransport, and Ethernet. Other implementations of differential signaling may be found in emitter coupled logic (ECL), positive emitter coupled logic (PECL), low voltage positive emitter coupled logic (LVPECL), musical instrument digital interface (MIDI), transition minimized differential signaling, and firewire.

SUMMARY

According to an embodiment of the present invention, an electronic device is provided. The electronic device may include at least one layer forming a plane and having a plurality of interconnects passing through at least a portion of the layer; each of the plurality of interconnects having a longitudinal axis substantially perpendicular to the plane, the plurality of interconnects are orthogonally arranged in a grid pattern and evenly spaced by a first distance, the plurality of interconnects include: a first differentially driven signal conductor pair with conductors arranged next to each other in a first direction, the first direction is oriented diagonally relative to the orthogonal grid pattern, a second differentially driven signal conductor pair with conductors arranged next to each other in a second direction substantially perpendicular to the first direction, each conductor of the second differentially driven signal conductor pair is spaced by the first distance from each signal conductor of the first differentially driven signal conductor pair, and a third differentially driven signal conductor pair with conductors arranged next to each other in a third direction substantially parallel to the first direction, each conductors of the third differentially driven signal conductor pair is spaced by the first distance from one of the signal conductors of the second differentially driven signal conductor pair.

According to another embodiment of the present embodiment, interconnect array pattern is provided. The interconnect array pattern may include a plurality of signal elements and a plurality of power/ground elements evenly spaced by a first distance and orthogonally arranged in a grid pattern, a first differentially driven signal conductor pair including two of the plurality of signal elements arranged next to each other and spaced apart by a second distance in a first direction, the first direction is oriented diagonally relative to the orthogonal grid pattern, a second differentially driven signal conductor pair including two of the plurality of signal elements arranged next to each other and spaced apart by the second distance in a second direction substantially perpendicular to the first direction, each signal element of the second differentially driven signal conductor pair is spaced by the first distance from each signal element of the first differentially driven signal conductor pair, and a third differentially driven signal conductor pair including two of the plurality of signal elements arranged next to each other and spaced apart by the second distance in a third direction substantially parallel to the first direction, each signal element of the third differentially driven signal conductor pair is spaced by the first distance from one of the signal elements of the second differentially driven signal conductor pair, where the power/ground elements are arranged in a single row diagonally across the orthogonal grid pattern such that the plurality of power/ground elements are spaced apart from each other by the second distance in the second direction.

According to another embodiment of the present embodiment, an electronic device is provided. The electronic device may include a plurality of signal elements and a plurality of power/ground elements evenly spaced by a first distance and orthogonally arranged in a grid pattern, where the plurality of signal elements and the plurality of power/ground elements are arranged into rows and columns of the orthogonal grid pattern, each row of the orthogonal grid pattern includes a repeating pattern of three signal elements and a single ground element, where successive sets of three signal elements are separated along the row by a single ground element, the repeating pattern of conductors in each row is offset by one column and repeated in successive rows, creating three diagonal rows of signal elements followed by a single diagonal row of ground elements.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which:

FIG. 6 is a cross-sectional view of the interconnect array pattern which illustrates crosstalk for all elements of the interconnect array pattern in accordance with an exemplary embodiment;

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
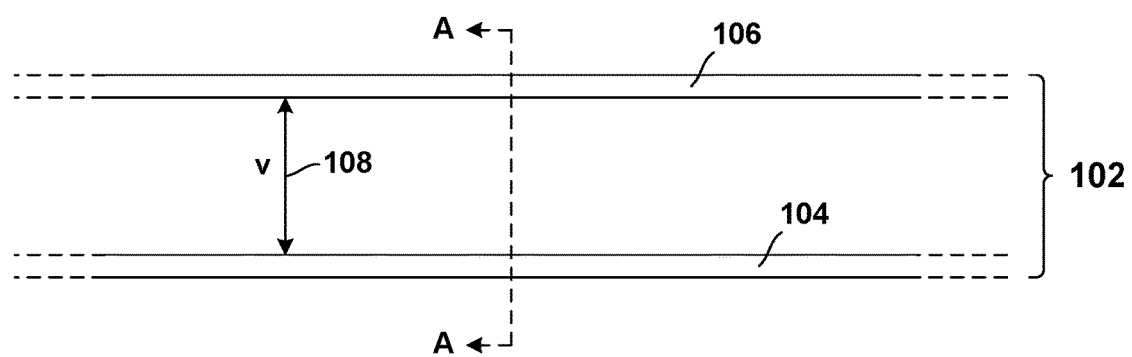
FIG. 1 is a perspective view of differential transmission lines.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "an embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

In high-speed electronic package and printed circuit board design, interconnect arrays are widely used. The total number of array elements in an array is limited by the interface area and the pitch or density of the interconnect array. In an embodiment, the interconnect array may include a vertical array including elements, such as, for example, balls, pins, or vias. The array elements may be divided into two groups, the signal group and the power/ground group. The power/ground elements provide not only the power supply, but also the return path to signal channel and the shielding between signal channels. In most designs, a large signal-to-ground ratio in the array is preferred to make full use of the limited number of the array elements. However, too large of a signal-to-ground ratio will result in poor signal return path (especially in single ended application) and less shielding between signal channels (in both single-ended and differential applications).

The present invention generally relates to electrical interconnects in integrated circuits, and more particularly to minimizing signal crosstalk using an interconnect array pattern with a 3:1 signal-to-ground ratio. One way to use the interconnect array pattern with a 3:1 signal-to-ground ratio to minimize differential crosstalk may include using a unique orthogonal pair interconnect pattern. An embodiment by which to minimize differential crosstalk using the interconnect array pattern with a 3:1 signal-to-ground ratio is described in detail below with reference to FIGS. 1-6.

The illustrative embodiments described herein provide an apparatus and method for facilitating signal transmission using differential transmission lines organized according to a diagonal interconnect pattern. The diagonal interconnect pattern includes a plurality of signal elements and a plurality of power/ground elements. In an embodiment, the plurality of signal elements and the plurality of power/ground elements of the diagonal interconnect pattern are orthogonally arranged in a grid having rows and columns. Each row of the grid includes a repeating pattern of three signal elements and a single ground element, where successive sets of three signal elements are separated along the row by a single power/ground element. The repeating pattern of each row is offset by one column and repeated in successive rows, creating three diagonal rows of signal elements followed by a single diagonal row of power/ground elements. The diagonal interconnect pattern includes a 3:1 signal-to-ground ratio. The diagonal interconnect pattern of this embodiment is fully repeatable in either direction, across successive row, across successive columns, or both. Because all elements of the diagonal interconnect pattern are arranging in a grid, each element is equidistant from all adjacent elements. In an embodiment, the signal elements of the diagonal interconnect pattern may be assigned as differential pairs in which the nearby power/ground element offer some shielding against crosstalk.

In an embodiment, the apparatus includes a first differential transmission line. The first differential transmission line includes a first plurality of conductors. The first plurality of conductors includes a first conductor and a second conductor. A conductor is any material capable of conducting electricity. The apparatus also includes a second differential transmission line. The second differential transmission line includes a second plurality of conductors. The second plurality of conductors includes a third conductor and a fourth conductor. The apparatus further includes a third differential transmission line. The third differential transmission line includes a third plurality of conductors. The third plurality of conductors includes a fifth conductor and a sixth conductor.

In an embodiment, a first noise produced by the first conductor of the first plurality of conductors is balanced by a second noise produced by the second conductor of the first plurality of conductors. A third noise produced by the third conductor of the second plurality of conductors is balanced by a fourth noise produced by the fourth conductor of the second plurality of conductors. A fifth noise produced by the fifth conductor of the third plurality of conductors is balanced by a sixth noise produced by the sixth conductor of the third plurality of conductors. A noise is any effect on the set of conductors caused by at least one of the second plurality of conductors. For example, a noise may be a voltage aberration on the set of conductors caused by at least one of the second plurality of conductors.

The first noise and the second noise are "balanced" if the first noise and second noise cause no change in the original signal carried by the first differential transmission line that would change a device's interpretation of the original signal. The same is true for both the second differential transmission line and the third differential transmission line. As used in these examples, an interpretation is any meaning or representation attributed to the original signal. The device is any device capable of detecting a difference between two conductors in a differential transmission line, such as an oscilloscope, bit error rate tester, or differential receiver circuit. In another embodiment, the first noise and the second noise are "balanced" if a signal carried by the first differential transmission line is changed by less than a predefined threshold amount.

In an embodiment, a the first noise produced by the first conductor on the first plurality of conductors is balanced by the second noise produced by the second conductor on the first plurality of conductors if a negligible amount of net noise is produced by the first conductor and the second conductor on the first plurality of conductors. Again, the same is true for both the second plurality of conductors and the third plurality of conductors. Net noise is the cumulative effect of the first noise and the second noise on the set of conductors. A negligible amount of net noise is an amount of net noise that causes no change in the original signal carried by the first differential transmission line that would change a device's interpretation of the original signal. In another embodiment, a negligible amount of net noise is a predefined threshold amount of noise. In one example, the negligible amount of net noise is zero.

In another embodiment, the first plurality of conductors defines a first axis and the second plurality of conductors defines a second axis. In this embodiment, the first axis forms an angle with the second axis. In one example, the angle is approximately ninety degrees. "Approximately" means that the angle's deviation from ninety degrees is too slight to cause a change in a device's interpretation of the original signal carried by the first differential transmission line. In another example, "approximately" means that the angle's deviation from ninety degree is less than a predefined threshold amount. In this embodiment, the first axis intersect the second axis at or near its midpoint. Similarly, the second axis intersects the first axis at or near its midpoint.

In another embodiment, the third plurality of conductors defines a third axis. The third axis is substantially perpendicular to, but does not intersect, the first axis and substantially parallel to the second axis. Again, "substantially" means that the third axis' deviation from being perpendicular to the first axis is too slight to cause a change in a device's interpretation of the original signal carried by the first differential transmission line. In another example, "substantially" means that the third axis' deviation from being perpendicular is less than a predefined threshold amount.

In an embodiment, the first differential transmission line is located along the line of symmetry of the second differential transmission line, and the second differential transmission line is located along the line of symmetry of the first differential transmission line. Furthermore, the second differential transmission line is located along the line of symmetry of the third differential transmission line.

In general, the line of symmetry of the first differential transmission line dissects the first axis; the line of symmetry of the second differential transmission line dissects the second axis; and the line of symmetry of the third differential transmission line dissects the third axis. In an embodiment, the line of symmetry of the third differential transmission line dissects the first axis of the first differential transmission line, and the line of symmetry of the first differential transmission line dissects the third axis of the third differential transmission line.

In an embodiment, a fifth noise produced by the fifth conductor on the fourth conductor of the second plurality of conductors is balanced by a sixth noise produced by the sixth conductor on the second conductor of the second plurality of conductors if a negligible amount of net noise is produced by the fifth conductor and the sixth conductor of the third plurality of conductors. Net noise is the cumulative effect of the fifth noise and the sixth noise on the second plurality of conductors. A negligible amount of net noise is an amount of net noise that causes no change in the original signal carried by the second differential transmission line that would change a device's interpretation of the original signal. In another embodiment, a negligible amount of net noise is a predefined threshold amount of noise. In one example, the negligible amount of net noise is zero.

Referring now to FIG. 1, a perspective view of a differential transmission line is shown. Specifically, FIG. 1 shows differential transmission line 102, which may be implemented in accordance with the illustrative embodiments.

The differential transmission line 102 includes conductors 104 and 106. The conductors 104 and 106 may be components of a circuit or circuits and include, among other structures, lines and vias in printed circuit boards, electronic packages, integrated circuits, cables, connectors or other devices. The conductors 104 and 106 may pass through at least a portion of a layer of a printed circuit board, electronic package, integrated circuit, or other device to form the designed electrical connection. The conductors 104 and 106 may also be referred to as a "trace" or a "phase" of the differential transmission line 102. The conductors 104 and 106 may be composed of any conductive material. For example, the conductors 104 and 106 may be composed of copper, silver, aluminum, gold, nickel, molybdenum, tungsten, or any combination thereof.

The differential transmission line 102 transmits a signal. In one non-limiting example, the signal may be obtained by measuring a voltage difference 108 between conductors 104 and 106. In this example, the voltage difference 108 may be measured by any device, such as an oscilloscope, bit error rate tester, or differential receiver circuit.

In one non-limiting example of a signal that may be transmitted by the differential transmission line 102, the differential transmission line 102 may transmit either a high-logic state signal, such as "1", or low-logic state signal, such as "0". A high-logic state signal, in one example, may be present when the conductor 104 has a predefined non-zero voltage $V_s$ and the conductor 106 has a voltage of zero. A low-logic state signal, in one example, may be present when the conductor 104 has a voltage of zero and the conductor 106 has a predefined non-zero voltage $V_s$. The differential transmission line 102 may be used to send any type of signal, which may be obtained or interpreted by measuring the voltage difference 108. Non-limiting examples of signals that may be transmitted include digital logic signals, analog baseband signals, or modulated carrier signals. Examples of modulated carrier signals include, among others, frequency modulated signals, amplitude modulated signals, phase modulated signals, and single sideband signals.

Noise may be introduced onto any of the conductors 104 and 106 by any outside source capable of producing electromagnetic emissions, such as other differential transmission lines. In the case in which the differential transmission line 102 transmits a high-logic state signal or low-logic state signal, the presence of another differential transmission line may introduce noise onto any one of the conductors 104 and 106. In fact, the presence of another differential transmission line threatens the integrity of the original signal transmitted by the differential transmission line 102. For example, because the voltage difference between the high-logic state and the low-logic state is $V_s$ times two ($2V_s$), any noise caused by the presence of another differential transmission line that exceeds $2V_s$ results in a changed interpretation of the original signal by any device measuring the voltage difference 108. In a more specific example, in the case in which the differential transmission line 102 transmits a low-logic state signal, a noise that is greater than $2V_s$ on either or both of the conductors 104 and 106 may result in the failure of a measuring device to interpret the voltage difference 108 as a low-logic state signal.

In another example, the conductors 104 and 106 may be balanced or unbalanced lines. In the example in which the conductors 104 and 106 are balanced lines, each of the conductors 104 and 106 have equal impedance to ground or other circuits. A balanced line reduces noise on the conductors 104 and 106 by rejecting common-mode interference.

Figure 2:
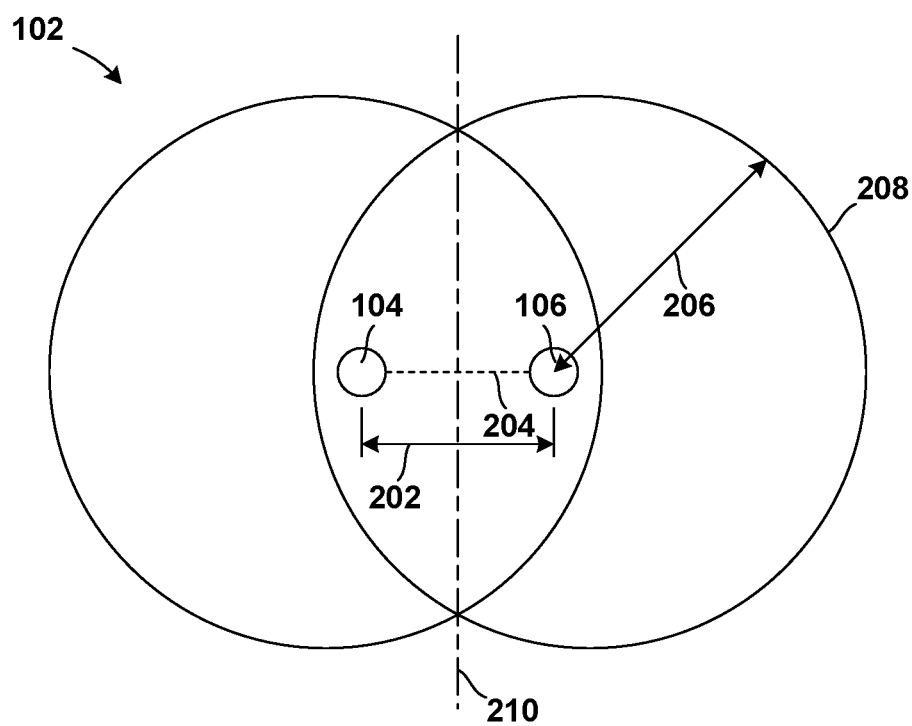
FIG. 2 is a cross-sectional view of a differential transmission line on which the illustrative embodiments may be implemented.

Referring now to FIG. 2, a cross-sectional view of a differential transmission line on which the illustrative embodiments may be implemented is shown. Specifically, FIG. 2 shows a cross-sectional view of the differential transmission line 102 of FIG. 1 as indicated by cross-sectional line A-A.

The conductors 104 and 106 may have any shape. As shown, the conductors 104 and 106 have a circular cross-sectional shape. However, the conductors 104 and 106 may also have a cross-sectional shape that is a square, rectangle, ellipse, triangle, or any polygon.

The differential transmission line 102 includes the conductors 104 and 106, which are separated by a distance 202. The conductors 104 and 106 define an axis 204, which is the shortest distance connecting the conductors 104 and 106.

FIG. 2 also shows an isolation distance 206. The isolation distance 206 is the smallest distance between the conductor 106 and another electromagnetic source, such as another differential transmission line, at which a negligible amount of noise is introduced on conductor 106. Hence, if a conductor from another differential transmission line is present in an area 208, non-negligible amounts of noise will be introduced onto the conductor 106. In an embodiment, the isolation distance 206 is larger than the distance 202 such that the noise coupling is minimized between conductors 104 and 106.

A line of symmetry 210 dissects the axis 204. The line of symmetry 210 is also perpendicular to the axis 204. The line of symmetry 210 may intersect the axis 204 at the midpoint of the axis 204. Alternatively, the line of symmetry 210 may intersect the axis 204 at any point along axis 204.

In one example, external signal induction that equally affects the conductors 104 and 106 will be rejected. Hence, one or more signal traces, conductors, pins, or vias that are positioned along the line of symmetry 210 will be at the same distance from both of the conductors 104 and 106, and will induce the same amount of noise on each of the conductors 104 and 106. Thus, the induced noise will be ignored.

Figure 3:
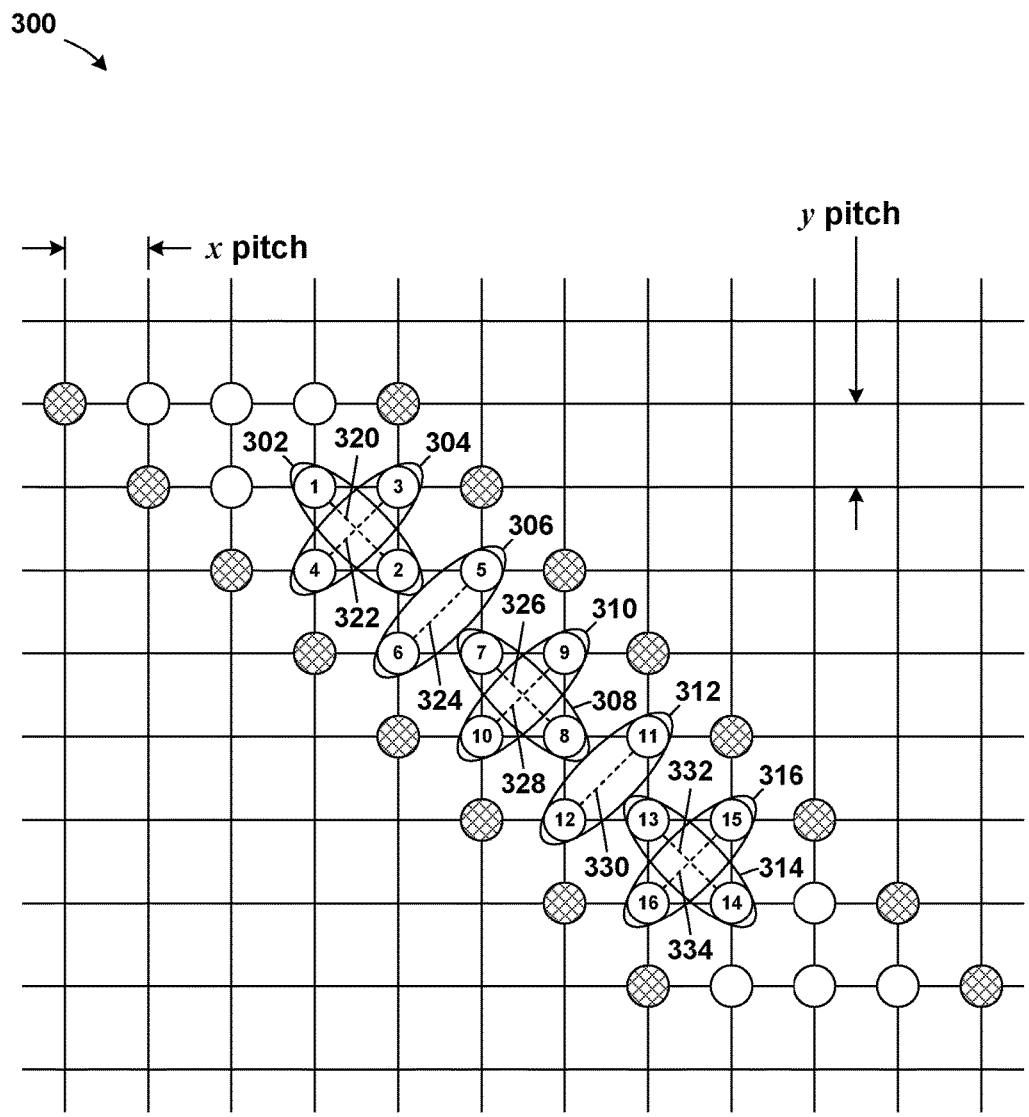
FIG. 3 is a cross-sectional view of an interconnect array pattern in accordance with an exemplary embodiment.
Figure 3:
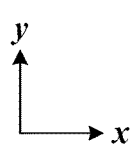

Referring now to FIG. 3, a cross-sectional view of an interconnect array pattern 300 is shown in accordance with an embodiment. More specifically, the interconnect array pattern 300 includes a plurality of differential transmission lines organized and arranged in a unique, fully repeatable, pattern which maximizes array element density across an interface area and reduces cross-talk between adjacent differential transmission lines. One or all of the differential transmission lines of the interconnect array pattern 300 may be substantially similar to the differential transmission line 102 described above with reference to FIGS. 1 and 2.

The array elements of the interconnect array pattern 300 are divided into two groups, a signal group and a power/ground group. The power/ground elements provide not only the power supply, but also the return path to signal elements and the shielding between signal elements. In general, signal elements are paired together to create differential transmission lines, and each signal element of a differential transmission line may be referred to as a conductor, as above. As indicated by the key of FIG. 3, the signal elements of the interconnect array pattern 300 are identified by a number, and the power/ground elements are cross-hatched and are not identified by a number. Like the signal elements the power/ground elements may also be components of a circuit or circuits and include, among other structures, lines and vias in printed circuit boards, electronic packages, integrated circuits, cables, connectors or other devices. Also like the signal elements, the power/ground elements may pass through at least a portion of a layer of a printed circuit board, electronic package, integrated circuit, or other device to form the designed electrical connection.

In the present embodiment, the interconnect array pattern 300 uses a particular orthogonal differential pair pattern to minimize the differential crosstalk in differential interconnect array, for example a via array of a package and printed circuit board.

The signal elements of the interconnect array pattern 300 may be arranged in a cross or diagonal pattern. A diagonal pattern of differential transmission lines, such as that of the interconnect array pattern 300, may allow for an increased density of differential transmission lines per unit area. The power/ground elements of the pattern 300 are symmetrically disposed relative to the signal elements. In general, all of the elements of the interconnect array pattern 300 may be spaced in an orthogonal or grid fashion with a common pitch in both the x and y directions. Further, the pitch in the x direction (x pitch) may be substantially equal to the pitch in the y direction (y pitch). In general, the pitch between elements may range from about 0.6 mm to about 2.0 mm on a printed circuit board, and from about 5 nm to about 250 nm on a chip. The interconnect array pattern 300 of the present embodiment offers two distinct advantages (1) a 3:1 signal-to-ground ratio which achieves efficient use of limited array element space; and (2) the pattern 300 is fully repeatable for ease of package and printed circuit design. Additionally, the orthogonal configuration of the interconnect array pattern 300 works to minimize or eliminate crosstalk between elements.

More specifically, the interconnect array pattern 300 of the present embodiment includes differential transmission lines 302, 304, 306, 308, 310, 312, 314, and 316 and surrounding ground elements in the diagonal pattern. One or more signals may be transmitted using differential transmission lines 302, 304, 306, 308, 310, 312, 314, and 316. The differential transmission lines 302, 304, 306, 308, 310, 312, 314, and 316 are non-limiting examples of the differential transmission line 102 of FIGS. 1 and 2. For example, the differential transmission lines 302, 304, 306, 308, 310, 312, 314, and 316, each includes conductors 1 and 2; 3 and 4; 5 and 6; 7 and 8; 9 and 10; 11 and 12; 13 and 14; and 15 and 16, respectively. Each of the differential transmission lines 302, 304, 306, 308, 310, 312, 314, and 316, are identified in the figure by an elliptical ring surrounding each differential pair of conductors. The differential transmission lines of the interconnect array pattern 300 may alternatively be referred to as differential pairs. Further, the differential transmission lines 302, 304, 306, 308, 310, 312, 314, and 316, each define an axis 320, 322, 324, 326, 328, 330, 332, and 334, respectively. In addition to the diagonal pattern, the interconnect array pattern 300 may be referred to as an orthogonal differential pair pattern in which differential pairs of conductors, for example 302, 304, 306, 308, 310, 312, 314, and 316, are organized orthogonally with respect to one another in order to minimize or eliminate crosstalk.

It should be noted that additional differential transmission lines and ground elements are depicted; however the below discussion will be primarily directed to the differential transmission lines 302, 304, 306, 308, 310, 312, 314, and 316. While the follow description is focused on the differential transmission lines 302, 304, 306, 308, 310, 312, 314, and 316, the same will be understood to apply equally to the entire interconnect array pattern 300, including any and all differential transmission lines not specifically referenced or illustrated. The same applies to any and all ground elements.

Differential transmission lines 302, 308, and 314 each have the same orientation because each of these differential transmission lines have axes that lie in the same directional plane. The distance between any two adjacent conductors of differential transmission lines 302, 308, and 314 of the present embodiment may be solved using Pythagorean's Theorem due to the fact that all elements in the interconnect array pattern 300 are arranged in an orthogonal pattern. For example, if the pitch is equal to 1, conductor 2 of differential transmission line 302 is separated from conductors 1 and 7 by a distance equal to approximately 1.4.

Similarly, differential transmission lines 304, 306, 310, 312, and 316 each have the same orientation because each of these differential transmission lines have axes that lie in the same directional plane. Stated differently, the distance between any two adjacent conductors of differential transmission lines 304, 306, 310, 312, and 316 of the present embodiment may also be solved using Pythagorean's Theorem due to the fact that all elements in the interconnect array pattern 300 are arranged in an orthogonal pattern. For example, if the pitch is equal to 1, conductors 3 and 4 of differential transmission line 304 are separated by a distance equal to approximately 1.4. The same is true for conductors 5 and 6, 9 and 10, 11 and 12, and 15 and 16. Further, for example, if the pitch is equal to 1, conductor 3 of differential transmission line 304 is separated from conductor 5 of differential transmission line 306 by a distance equal to approximately 1.4. The distance between any two adjacent conductors of differential transmission lines 304, 306, 310, 312, and 316 of the present embodiment may also be solved using Pythagorean's Theorem.

In an embodiment, axes 320, 326, and 332 are perpendicular to axes 322, 324, 328, 330, and 334. In another embodiment, the direction along which axes 320, 326, and 332 lie is oriented approximately ninety degrees from the direction along which axes 322 324, 328, 330, and 334 lie. Also, axes 320, 326, and 332 intersect axes 322, 328, and 334 at or near their midpoints, respectively.

In an embodiment, axis 320 forms an angle with axis 322. In one example, the angle is approximately ninety degrees. In this embodiment, axis 320 intersects axis 322 at or near its midpoint. Similarly, axis 322 intersects axis 320 at or near its midpoint. In another embodiment, axis 324 is substantially perpendicular to, but does not intersect, axis 320 and substantially parallel to axis 322. In an embodiment, differential transmission line 302 is located along a line of symmetry of differential transmission line 304, and differential transmission line 304 is located along a line of symmetry of differential transmission line 302. Furthermore, differential transmission line 302 is also located along a line of symmetry of differential transmission line 306.

In general, the line of symmetry of differential transmission line 302 dissects axis 320; the line of symmetry of differential transmission line 304 dissects axis 322; and the line of symmetry of differential transmission line 306 dissects axis 324. In an embodiment, the line of symmetry of differential transmission line 306 dissects axis 322 of differential transmission line 304, and the line of symmetry of differential transmission line 304 dissects axis 324 of differential transmission line 306.

In one embodiment, differential transmission line 304 is positioned between conductors 1 and 2 of differential transmission line 302, differential transmission line 310 is positioned between conductors 7 and conductor 8 of differential transmission line 308, and differential transmission line 316 is positioned between conductors 13 and conductor 14 of differential transmission line 314. Differential transmission line 306 is perpendicular to and positioned between differential transmission lines 302 and 308, and differential transmission line 312 is perpendicular to and positioned between differential transmission lines 308 and 314. As described above, each row of the interconnect array pattern 300 includes a repeating pattern of three signal elements separated by a single power/ground element.

In an embodiment, differential transmission lines 302, 304, 306, 308, 310, 312, 314, and 316 facilitate signal transmission using vias. A via is a plated hole that connects conductors from one layer of a circuit board to conductors from another layer of the circuit board. Alternatively, differential transmission lines 302, 304, 306, 308, 310, 312, 314, and 316 may be used to facilitate signal transmission between any components of a circuit board.

In an embodiment, differential transmission lines 302, 304, 306, 308, 310, 312, 314, and 316 facilitate signal transmission in a pin arrangement. Pins are connecting interfaces between computing devices. For examples, plug-in connectors for computers often include pin arrangements, which facilitate communication to and from an external device.

Figure 4:
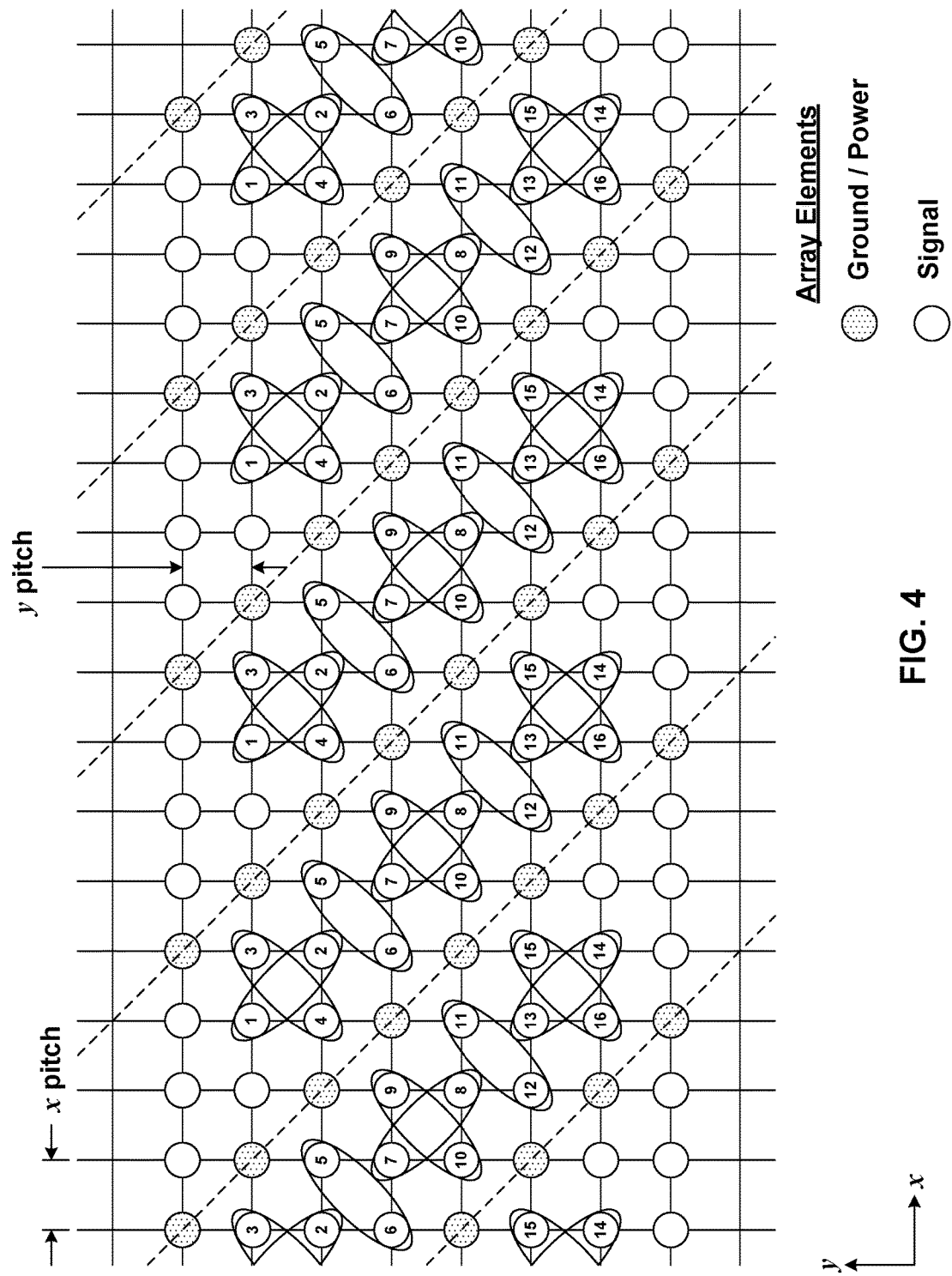
FIG. 4 is a cross-sectional view of the interconnect array pattern repeated in accordance with an exemplary embodiment.

Referring now to FIG. 4, the proposed interconnect array pattern is shown after being repeated in an x direction. The interconnect array pattern 300 is fully repeatable in both the x and y directions while maintaining a 3:1 signal-to-ground ratio. Furthermore, the interconnect array pattern 300 allows for complete use of every element in the pattern which translates to increased element density and more efficient used of available interconnect area. The repeatability of the interconnect array pattern 300 extends the local signal density to a larger area while the overall signal density remains the same as the local signal density.

Figure 5:
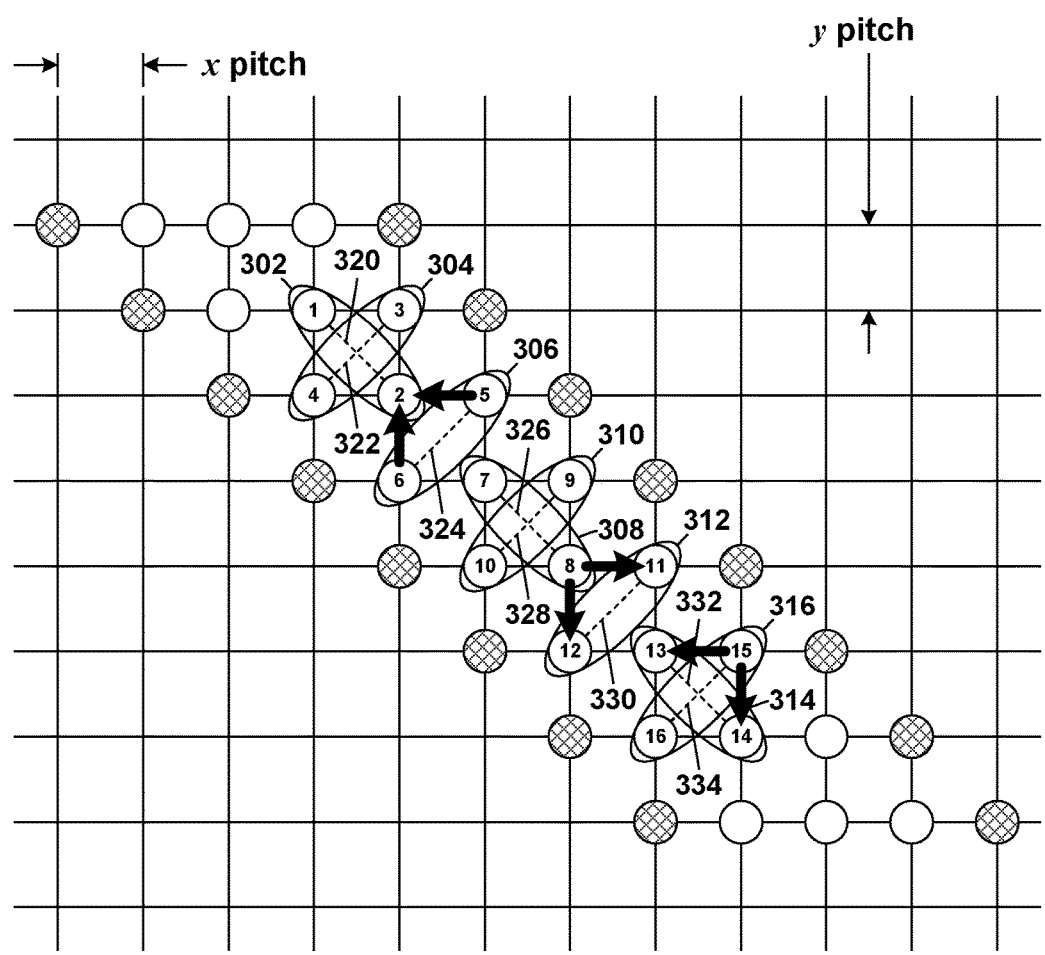
FIG. 5 is a cross-sectional view of the interconnect array pattern which illustrates crosstalk for select elements of the interconnect array pattern in accordance with an exemplary embodiment.

Referring now to FIGS. 5 and 6, the differential crosstalk cancellation of the interconnect array pattern 300 is shown. More specifically, the differential crosstalk cancellation with respect to certain pairs of elements within the interconnect array pattern 300 is depicted in FIG. 5, and the differential crosstalk cancellation with respect to all elements within the interconnect array pattern 300 is depicted in FIG. 6.

With specific reference to FIG. 5, in general, complete or near complete cancellation of crosstalk may be achieved for differential applications for all elements of the interconnect array pattern 300 spaced a distance of 1.0 pitch from one another. These scenarios are illustrated in the figure with solid black arrows.

For example, conductor 5 will have an opposite signal sign from conductor 6 because they are two legs of the same differential pair. Therefore, the crosstalk from conductor 5 to conductor 2 will cancel the crosstalk from conductor 6 to conductor 2. Similarly the reverse is true, for example the crosstalk from conductor 8 to conductor 11 cancels the crosstalk from conductor 8 to conductor 12.

In an embodiment, a first noise produced by conductor 5 on conductor 2 is balanced by a second noise produced by conductor 6 on conductor 2. The first noise and the second noise are "balanced" if the first noise and second noise cause no change in a signal carried by differential transmission line 302 that would change a device's interpretation of the signal. An interpretation is any meaning or representation attributed to the signal. For example, assuming that a device interprets a voltage differential of six volts as a '1', in the case in which the differential transmission line 302 has a voltage differential of six volts, the first noise and the second noise are balanced if the device interprets the voltage differential as a '1'. In this example, if the device interprets the voltage differential as anything other than '1', such as '0', then the first noise and the second noise are unbalanced.

In another embodiment, a negligible amount of net noise is produced by conductors 1 and 2 on either or both of conductors 1 or 2. For example, the negligible amount of net noise on either or both of conductors 1 or 2 may be zero or approximately zero. Further, in an embodiment, the net noise on conductor 1 may generally match the net noise on conductor 2. In such case, because conductors 3 and 4 are located at the same distance from both of conductors 1 and 2, conductors 3 and 4 produce the same amount of noise on each of conductors 1 and 2. Because each conductor 1 and 2 is affected equally, the noise will be ignored during a differential signal measurement.

The power/ground elements provide shielding between differential pairs (reducing inter-pair crosstalk) and reducing the effects by unwanted common mode. More power/ground elements will result in better signal integrity quality, but result in lower signal element density in a particular interconnect array pattern. An appropriate signal-to-ground ratio such as 1:1, 2:1, 3:1, 4:1, etc. may be selected based on the particular application.

With specific reference to FIG. 6, the differential crosstalk cancellation with respect to all elements within the interconnect array pattern 300 is shown. In short, crosstalk or noise will effectively be completely canceled between all array elements spaced a distance of 1.0 pitch from each other for differential signaling or differential mode applications. Meanwhile all crosstalk or noise from the array elements spaced a distance of 1.4 pitch still have some effect on adjacent elements for differential mode applications. It should be noted, however, the crosstalk or noise from array elements spaced a distance of 1.4 pitch are much smaller than those array elements spaced a distance of 1.0 pitch.

The illustrative embodiments show differential transmission lines that facilitate signal transmission and increase the density of the differential transmission lines for a particular area. Normally, when multiple differential transmission lines are wired together, typically as part of a high-speed bus, the differential transmission lines need to be spaced apart from each other in order to minimize inter signal noise coupling. However, an external voltage noise induced equally among two conductor of a differential transmission line will be ignored during differential signal measurement, as the noise will have the same magnitude and phase in the two conductors. The non-limiting configurations shown in the illustrative embodiment are examples of how to balance noise such that the noise will be ignored or rejected.

Pair-to-pair isolation is also needed when the differential transmission lines go through non-planar structures. Non-planar structures are structures in which power planes are not present, such as via connections or component pins. A considerable amount of space is needed to arrange a via or pin field when multiple signal pairs are involved. The need for such space arises from the need to provide sufficient separation between pairs in all directions in order to minimize signal coupling among pairs. This results in larger components than needed and inefficient utilization of card wiring resources, and large timing differences between the signals.

The illustrative embodiments, and their exemplary use in vias and pin arrangements, maximize the number of differential transmission lines per unit area, while maintaining the required pair-to-pair isolation level. This is achieved by using the common noise rejection properties of differential signaling.

Thus, the illustrative embodiments minimize the space needed for differential transmission lines, thereby resulting in the more efficient use of hardware and time. For example, be being able to place more differential transmission lines per unit area, smaller and less expensive components are needed. Also, more signals may be transmitted for a given component size or a given amount of available card real estate.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

Embodiments of the present invention can take the form of an entirely hardware embodiment, an entirely software embodiment or an embodiment including both hardware and software elements. In an embodiment, the present invention is implemented in software, which includes but is not limited to firmware, resident software, microcode, etc. Such a software embodiment may take the form of a circuit design modeling program or diagnostic program.

Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that may include, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The present embodiment may be employed in or applied to a circuit as described herein as part of the design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The circuit or circuits may include, among other structures, lines and vias in printed circuit boards, packages, integrated circuits, cables, connectors or other devices.

Figure 7:
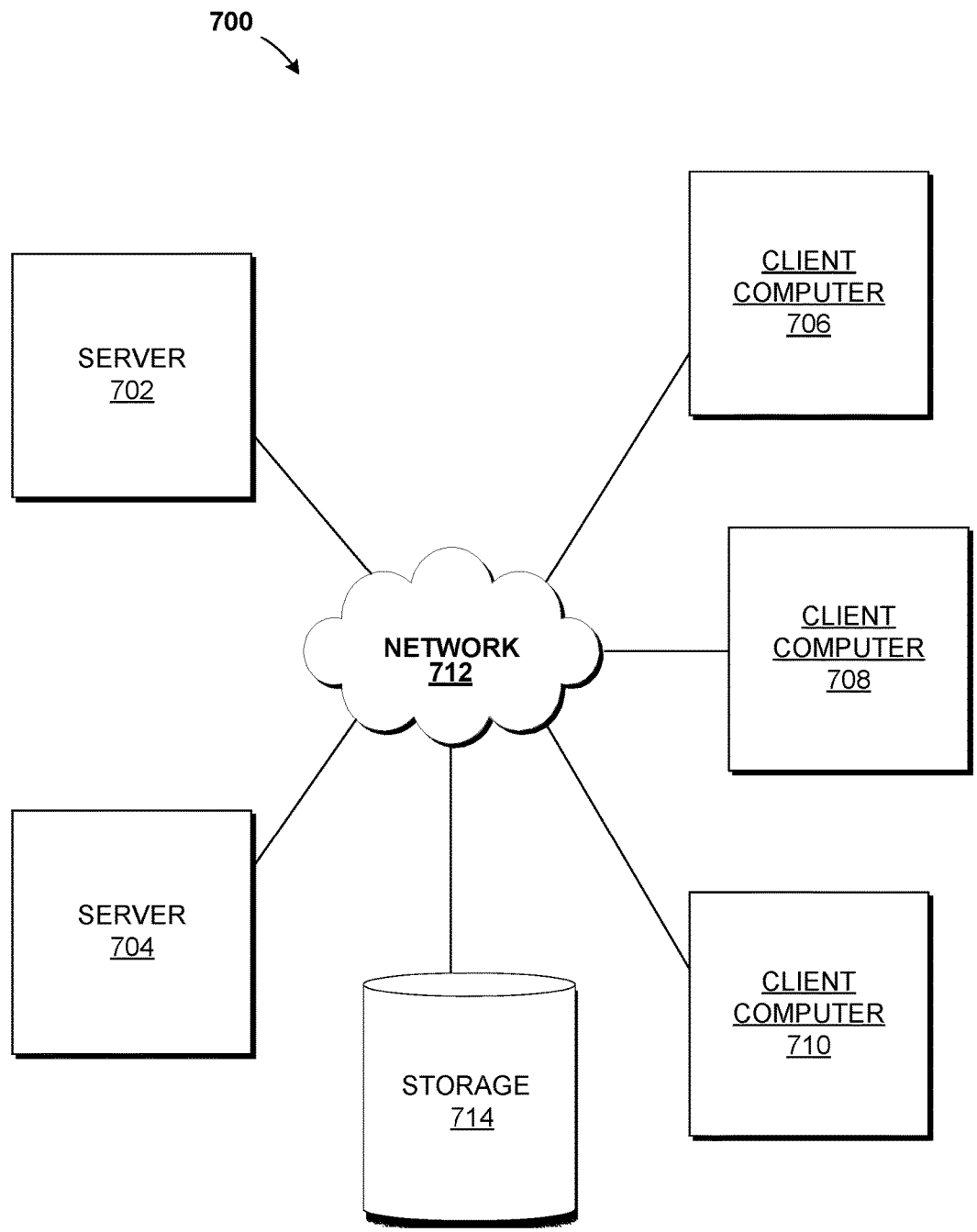
FIG. 7 is a functional block diagram illustrating a system for circuit design, circuit modeling, or circuit diagnostics in a networked computer environment in accordance with an exemplary embodiment.

Referring now to FIG. 7, a functional block diagram illustrating a network data processing system 700 in accordance with an embodiment of the present invention is shown. The system 700 may include server computers 702 and 704, client computers 706, 708, and 710, and a storage unit 714. The client computers 706, 708, and 710 may communicate with the server computers 702 and 704 via a communications network 712 (hereinafter "network"). Each of the client computers 706, 708, and 710 may include a processor and a data storage device that is enabled to interface with a user and communicate with one or more of the server computers 702 and 704. Each of the server computers 702 and 704 may also include a processor and a data storage device enabled to run, for example, the circuit design modeling program or diagnostic program.

In an embodiment, the client computers 706, 708, and 710 may operate as an input device including a user interface while the circuit design modeling program may run primarily one or more of the server computers 702 and 704. It should be noted, however, that processing for the circuit design modeling program may, in some instances be shared amongst the client computers 706, 708, and 710 and the server computers 702 and 704 in any ratio. In another embodiment, the circuit design modeling program may operate on more than one server computer, client computer, or some combination of server computers and client computers, for example, a plurality of client computers (706, 708, 710) communicating across the network 712 with a single server computer.

In an embodiment, the client computers 706, 708, and 710 may be, for example, personal computers or network computers. In the depicted example, the server computers 702 and 704 provide data, such as boot files, operating system images, and applications to the client computers 706, 708, and 710. The client computers 706, 708, and 710 may be clients to the server computers 702 and 704 in the present example. The server computers 702 and 704, the client computers 706, 708, and 710, and the storage unit 714 may be directly interconnected by differential transmission lines. The network data processing system 700 may include additional servers, clients, and other devices not shown.

The network 712 may include wired connections, wireless connections, fiber optic connections, or some combination thereof. In general, the network 712 can be any combination of connections and protocols that will support communications between the client computers 706, 708, and 710, and the server computers 702 and 704. The network 712 may include various types of networks, such as, for example, a local area network (LAN), a wide area network (WAN) such as the Internet, a telecommunication network, a wireless network, a public switched network and/or a satellite network.

In various embodiments, the client computers 706, 708, and 710 may be, for example, a laptop computer, tablet computer, netbook computer, personal computer (PC), a desktop computer, a personal digital assistant (PDA), a smart phone, a mobile device, or any programmable electronic device capable of communicating with the server computers 702, and 704 via the network 712. The client computers 706, 708, and 710 and the server computers 702 and 704 may each include internal and external components, as described below with reference to FIG. 8.

In an embodiment, the system 700 may include any number of client computers (706, 708, 710) and/or server computers (702, 704); however a discrete number of each is shown for illustrative purposes only. It may be appreciated that FIG. 7 provides only an illustration of one implementation and does not imply any limitations with regard to the environments in which different embodiments may be implemented. Many modifications to the depicted environments may be made based on design and implementation requirements.

Figure 8:
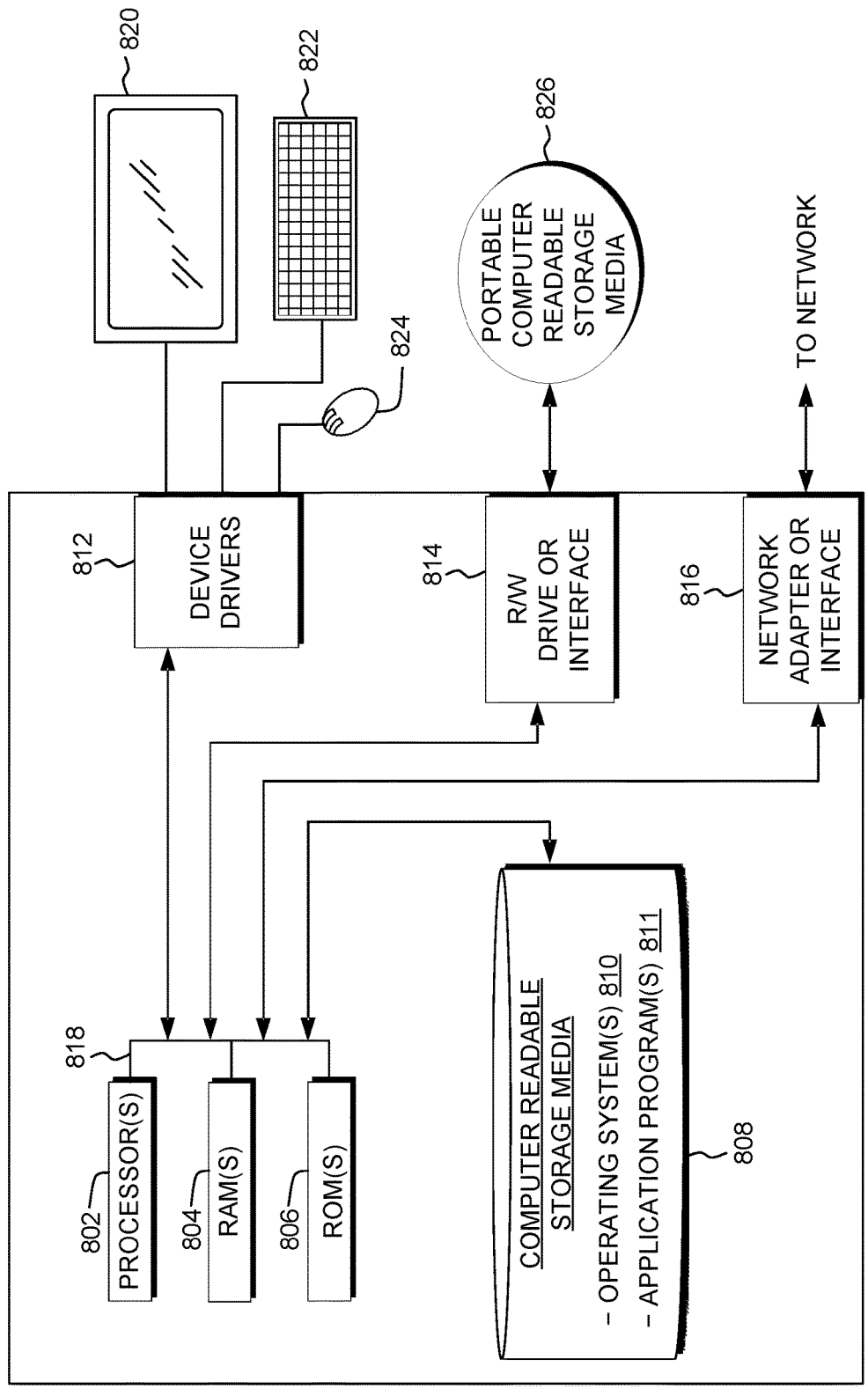
FIG. 8 is a functional block diagram of components of a server computer executing the circuit design modeling program or diagnostic program in accordance with an exemplary embodiment.

Referring now to FIG. 8, a block diagram of components of a computing device, such as the server computers 704 and 706 or the client computers 706, 708 and 710, of the system 700 of FIG. 7, in accordance with an embodiment of the present invention is shown. It should be appreciated that FIG. 8 provides only an illustration of one implementation and does not imply any limitations with regard to the environments in which different embodiments may be implemented. Many modifications to the depicted environment may be made.

The computing device may include one or more processors 802, one or more computer-readable RAMs 804, one or more computer-readable ROMs 806, one or more computer readable storage media 808, device drivers 812, a read/write drive or interface 814, a network adapter or interface 816, all interconnected over a communications fabric 818. The communications fabric 818 may be implemented with any architecture designed for passing data and/or control information between processors (such as microprocessors, communications and network processors, etc.), system memory, peripheral devices, and any other hardware components within a system.

One or more operating systems 810, and one or more application programs 811 are stored on the one or more of the computer readable storage media 808 for execution by one or more of the processors 802 via one or more of the respective RAMs 804 (which typically include cache memory). In the illustrated embodiment, each of the computer readable storage media 808 may be a magnetic disk storage device of an internal hard drive, CD-ROM, DVD, memory stick, magnetic tape, magnetic disk, optical disk, a semiconductor storage device such as RAM, ROM, EPROM, flash memory or any other computer-readable tangible storage device that can store a computer program and digital information.

The computing device may also include the R/W drive or interface 814 to read from and write to one or more portable computer readable storage media 826. Application programs 811 on the computing device may be stored on one or more of the portable computer readable storage media 826, read via the respective R/W drive or interface 814 and loaded into the respective computer readable storage media 808.

The computing device may also include the network adapter or interface 816, such as a TCP/IP adapter card or wireless communication adapter (such as a 4G wireless communication adapter using OFDMA technology). Application programs 811 on the computing device may be downloaded to the computing device from an external computer or external storage device via a network (for example, the Internet, a local area network or other wide area network or wireless network) and network adapter or interface 816. From the network adapter or interface 816, the programs may be loaded onto computer readable storage media 808. The network may include copper wires, optical fibers, wireless transmission, routers, firewalls, switches, gateway computers and/or edge servers.

The computing device may also include a display screen 820, a keyboard or keypad 822, and a computer mouse or touchpad 824. The device drivers 812 interface to the display screen 820 for imaging, to the keyboard or keypad 822, to the computer mouse or touchpad 824, and/or to the display screen 820 for pressure sensing of alphanumeric character entry and user selections. The device drivers 812, R/W drive or interface 814 and network adapter or interface 816 may include hardware and software (stored on computer readable storage media 808 and/or ROM 806).

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

Based on the foregoing, a computer system, method, and computer program product have been disclosed. However, numerous modifications and substitutions can be made without deviating from the scope of the present invention. Therefore, the present invention has been disclosed by way of example and not limitation.

Figure 9:
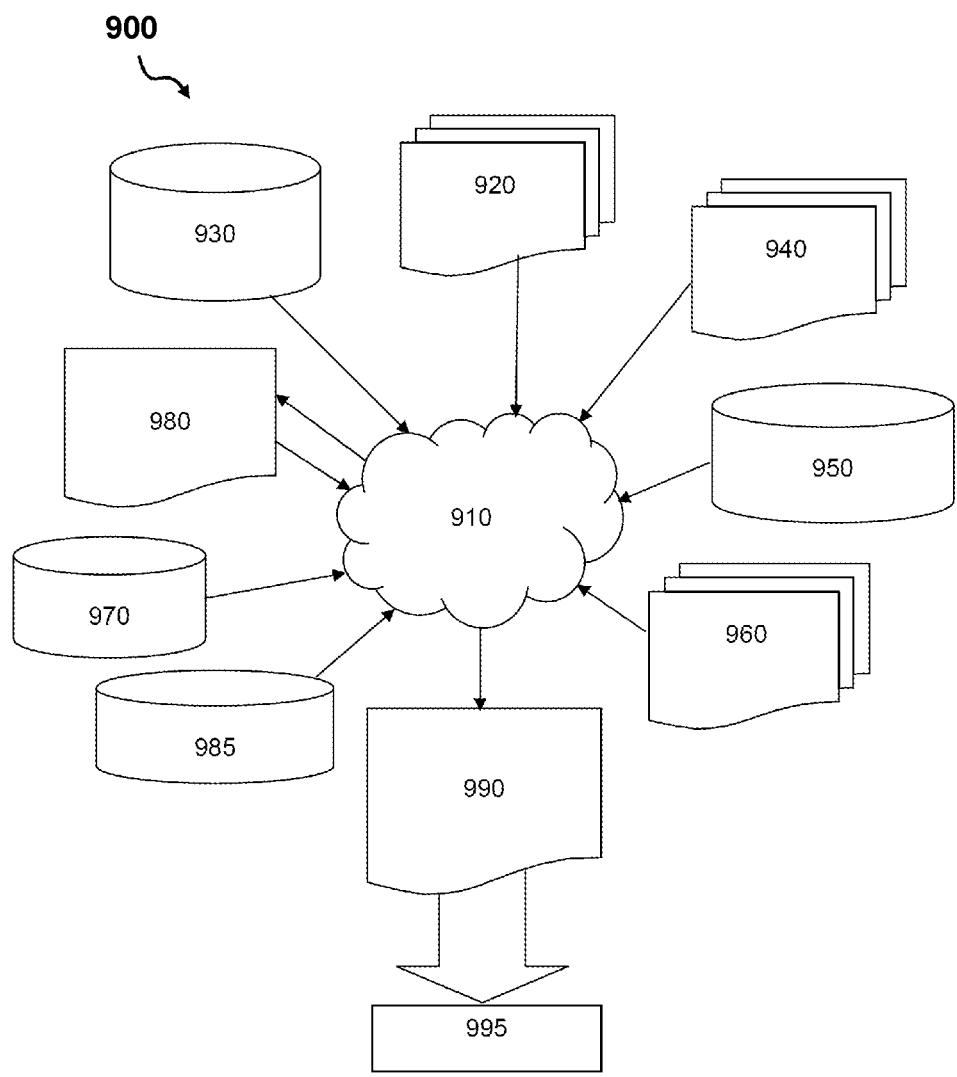
FIG. 9 is a flow diagram of a design process used in semiconductor design, manufacture, and/or test in accordance with an exemplary embodiment.

Now referring to FIG. 9 a block diagram of an exemplary design flow 900 used, for example, in semiconductor IC logic design, simulation, test, layout, and manufacture, is shown. The design flow 900 includes processes, machines and/or mechanisms for processing design structures or devices to generate logically or otherwise functionally equivalent representations of the design structures and/or devices described above and shown in FIGS. 1-6. The design structures processed and/or generated by the design flow 900 may be encoded on machine readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e beam writers), computers or equipment for simulating design structures, any apparatus used in the manufacturing or test process, or any machines for programming functionally equivalent representations of the design structures into any medium (e.g. a machine for programming a programmable gate array).

The design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 920 that is preferably processed by a design process 910. The design structure 920 may be a logical simulation design structure generated and processed by the design process 910 to produce a logically equivalent functional representation of a hardware device. The design structure 920 may also or alternatively comprise data and/or program instructions that when processed by the design process 910, generate a functional representation of the physical structure of a hardware device. Whether representing functional and/or structural design features, the design structure 920 may be generated using electronic computer-aided design (ECAD) such as implemented by a core developer/designer. When encoded on a machine-readable data transmission, gate array, or storage medium, the design structure 920 may be accessed and processed by one or more hardware and/or software modules within the design process 910 to simulate or otherwise functionally represent an electronic component, circuit, electronic or logic module, apparatus, device, or system such as those shown in FIGS. 1-6. As such, the design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

The design process 910 preferably employs and incorporates hardware and/or software modules for synthesizing, translating, or otherwise processing a design/simulation functional equivalent of the components, circuits, devices, or logic structures shown in FIGS. 1-6 to generate a Netlist 980 which may contain design structures such as the design structure 920. The Netlist 980 may include, for example, compiled or otherwise processed data structures representing a list of wires, discrete components, logic gates, control circuits, I/O devices, models, etc. that describes the connections to other elements and circuits in an integrated circuit design. The Netlist 980 may be synthesized using an iterative process in which the Netlist 980 is resynthesized one or more times depending on design specifications and parameters for the device. As with other design structure types described herein, the Netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

The design process 910 may include hardware and software modules for processing a variety of input data structure types including the Netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. The design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in the design process 910 without deviating from the scope and spirit of the invention. The design process 910 may also include modules for performing standard circuit design processes such as timing analysis, verification, design rule checking, place and route operations, etc.

The design process 910 employs and incorporates logic and physical design tools such as HDL compilers and simulation model build tools to process the design structure 920 together with some or all of the depicted supporting data structures along with any additional mechanical design or data (if applicable), to generate a second design structure 990. The second design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to the design structure 920, the second design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-6. In an embodiment, the second design structure 990 may comprise a compiled, executable HDL simulation model that functionally simulates the devices shown in FIGS. 1-6.

The second design structure 990 may also employ a data format used for the exchange of layout data of integrated circuits and/or symbolic data format (e.g. information stored in a GDSII (GDS2), GL1, OASIS, map files, or any other suitable format for storing such design data structures). The second design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-6. The second design structure 990 may then proceed to a stage 995 where, for example, the second design structure 990: proceeds to tape-out, is released to manufacturing, is released to a mask house, is sent to another design house, is sent back to the customer, etc.

What is claimed is:

1. An electronic device comprising:
    a plurality of interconnects orthogonally arranged in a grid pattern and evenly spaced by a first distance, the plurality of interconnects comprise:
        a first differentially driven signal conductor pair with conductors arranged next to each other in a first direction, the first direction is oriented diagonally relative to the orthogonal grid pattern;
        a second differentially driven signal conductor pair with conductors arranged next to each other in a second direction substantially perpendicular to the first direction, each conductor of the second differentially driven signal conductor pair is spaced by the first distance from each signal conductor of the first differentially driven signal conductor pair; and
        a third differentially driven signal conductor pair with conductors arranged next to each other in a third direction substantially parallel to the first direction, each conductor of the third differentially driven signal conductor pair is spaced by the first distance from one of the signal conductors of the second differentially driven signal conductor pair.

2. The electronic device of claim 1, wherein the plurality of interconnects further comprise:
    a plurality of power/ground conductors, wherein the plurality of interconnects comprise a 3:1 ratio of signal conductors to power/ground conductors.

3. The electronic device of claim 1, wherein the plurality of interconnects further comprise:
    a plurality of power/ground conductors,
    wherein the plurality of signal conductors and the plurality of power/ground conductors are arranged into rows and columns of the orthogonal grid pattern, each row of the orthogonal grid pattern includes a repeating pattern of three signal elements and a single power/ground element, where successive sets of three signal elements are separated along the row by a single power/ground element.

4. The electronic device of claim 1, wherein the plurality of interconnects further comprise:
    a plurality of power/ground conductors,
    wherein the plurality of signal conductors and the plurality of power/ground conductors are arranged into rows and columns of the orthogonal grid pattern, each row of the orthogonal grid pattern includes a repeating pattern of three signal elements and a single power/ground element the repeating pattern of conductors in each row is offset by one column and repeated in successive rows, creating three diagonal rows of signal elements followed by a single diagonal row of power/ground elements.

5. The electronic device of claim 1, wherein the first differentially driven signal conductor pair, second differentially driven signal conductor pair, and third differentially driven signal conductor pair are arranged in a fully repeatable pattern repeatable either an x direction or a y direction of the orthogonal grid pattern.

6. The electronic device of claim 1, wherein the first differentially driven signal conductor pair, second differentially driven signal conductor pair, and third differentially driven signal conductor pair are arranged in a fully repeatable pattern repeatable in the first direction.

7. The electronic device of claim 1, wherein the first differentially driven signal conductor pair, second differentially driven signal conductor pair, and third differentially driven signal conductor pair are arranged in a fully repeatable pattern repeatable in the second direction.

8. An electronic device comprising:
    at least one layer forming a plane and having a plurality of interconnects passing through at least a portion of the layer; each of the plurality of interconnects having a longitudinal axis substantially perpendicular to the plane, the plurality of interconnects are orthogonally arranged in a grid pattern and evenly spaced by a first distance, the plurality of interconnects comprise:
        a first differentially driven signal conductor pair with conductors arranged next to each other in a first direction, the first direction is oriented diagonally relative to the orthogonal grid pattern;
        a second differentially driven signal conductor pair with conductors arranged next to each other in a second direction substantially perpendicular to the first direction, each conductor of the second differentially driven signal conductor pair is spaced by the first distance from each signal conductor of the first differentially driven signal conductor pair; and
        a plurality of power/ground conductors, wherein the plurality of interconnects comprise a 3:1 ratio of signal conductors to power/ground conductors.

9. The electronic device of claim 8, wherein the plurality of interconnects further comprise:
    a plurality of power/ground conductors,
    wherein the plurality of signal conductors and the plurality of power/ground conductors are arranged into rows and columns of the orthogonal grid pattern, each row of the orthogonal grid pattern includes a repeating pattern of three signal elements and a single power/ground element.

10. The electronic device of claim 8, wherein the plurality of interconnects further comprise:
    a plurality of power/ground conductors,
    wherein the plurality of signal conductors and the plurality of power/ground conductors are arranged into rows and columns of the orthogonal grid pattern, each row of the orthogonal grid pattern includes a repeating pattern of three signal elements and a single ground element the repeating pattern of conductors in each row is offset by one column and repeated in successive rows, creating three diagonal rows of signal elements followed by a single diagonal row of power/ground elements.

11. The electronic device of claim 8, wherein the first differentially driven signal conductor pair and second differentially driven signal conductor pair are arranged in a fully repeatable pattern repeatable either an x direction or a y direction of the orthogonal grid pattern.

12. The electronic device of claim 8, wherein the first differentially driven signal conductor pair and second differentially driven signal conductor pair are arranged in a fully repeatable pattern repeatable in the first direction.

13. The electronic device of claim 8, wherein the first differentially driven signal conductor pair and second differentially driven signal conductor pair are arranged in a fully repeatable pattern repeatable in the second direction.

14. An electronic device comprising:
    a plurality of signal elements and a plurality of power/ground elements evenly spaced by a first distance and orthogonally arranged in a grid pattern,
    wherein the plurality of signal elements and the plurality of power/ground elements are arranged into rows and columns of the orthogonal grid pattern, each row of the orthogonal grid pattern includes a repeating pattern of three signal elements and a single power/ground element, the repeating pattern of conductors in each row is offset by one column and repeated in successive rows, creating three diagonal rows of signal elements followed by a single diagonal row of power/ground elements, wherein the plurality of signal elements comprise:
- a first differentially driven signal conductor pair comprising two of the plurality of signal elements arranged next to each other and spaced apart by a second distance in a first direction, the first direction is oriented diagonally relative to the orthogonal grid pattern;
- a second differentially driven signal conductor pair comprising two of the plurality of signal elements arranged next to each other and spaced apart by the second distance in a second direction substantially perpendicular to the first direction, each signal element of the second differentially driven signal conductor pair is spaced by the first distance from each signal element of the first differentially driven signal conductor pair.

15. The electronic device of claim 14, wherein the electronic device comprises a 3:1 ratio of signal elements to power/ground elements.

16. The electronic device of claim 14, wherein the electronic device comprises an integrated circuit or a printed circuit board.

17. The electronic device of claim 14, wherein the first differentially driven signal conductor pair and second differentially driven signal conductor pair are arranged in a fully repeatable pattern repeatable either an x direction or a y direction of the orthogonal grid pattern.

18. The electronic device of claim 14, wherein the first differentially driven signal conductor pair and second differentially driven signal conductor pair are arranged in a fully repeatable pattern repeatable in the first direction.

19. The electronic device of claim 14, wherein the first differentially driven signal conductor pair and second differentially driven signal conductor pair are arranged in a fully repeatable pattern repeatable in the second direction.

* * * * *